US005782980A

United States Patent [19]

Allen et al.

[11] Patent Number: 5,782,980
[45] Date of Patent: Jul. 21, 1998

[54] LOW PRESSURE CHEMICAL VAPOR DEPOSITION APPARATUS INCLUDING A PROCESS GAS HEATING SUBSYSTEM

[75] Inventors: Michael B. Allen; Dennis C. Swartz; Patrick B. Lee, all of Austin, Tex.

[73] Assignee: Advanced Micro Devices, Inc.

[21] Appl. No.: 645,619

[22] Filed: May 14, 1996

[51] Int. Cl.$^6$ .................................. C23C 16/00
[52] U.S. Cl. .................... 118/715; 118/724; 118/666; 118/667
[58] Field of Search ................ 118/715, 724, 118/725, 666, 667

[56] References Cited

U.S. PATENT DOCUMENTS

| 4,013,038 | 3/1977 | Rogers et al. | 118/5 |
| 4,316,430 | 2/1982 | Jolly et al. | 118/725 |
| 4,468,283 | 8/1984 | Ahmed | 156/642 |
| 4,516,527 | 5/1985 | Sugioka | 118/723 R |

(List continued on next page.)

FOREIGN PATENT DOCUMENTS

| 671761 A1 | 9/1995 | European Pat. Off. | 118/724 |
| 60-152674 | 8/1985 | Japan | 118/724 |
| 63-157859 | 6/1988 | Japan | 118/667 |
| 3-100168 | 4/1991 | Japan | 118/724 |
| 3-177574 | 8/1991 | Japan | 118/724 |
| 4-192519 | 7/1992 | Japan | 118/724 |
| 4-371581 | 12/1992 | Japan | 118/724 |
| 94/11901 | 5/1994 | WIPO | 118/724 |

OTHER PUBLICATIONS

Whitner, Apparatus of the Deposition of Silicon Nitride, IBM Technical Digest No. 11, pp. 5, 6, Jul. 1968.
Byrne et al, Semiconductor Furnace, IBM Technical Disclosure Bulletin, vol. 16, No. 5, pp. 1621, 1622, Oct. 1973.
Wolf, et al., Silicon Processing for the VLSI Era, vol. 1, pp. 161–197.

Kern et al., "Low–Pressure Chemical Vapor Deposition for Very Large–Scale Integration Processing—A Review," IEEE Transactions on Electronic Devices, vol. Ed–26, No. 4, Apr., 1979, pp. 647–657.
Singer, Peter H., "Techniques of Low Pressure Chemical vapor Deposition," Semiconductor International, May 1984, pp. 72–77.
Rosier, Richard S., "Low Pressure CVD Production Processes for Poly, Nitride, and Oxide," Solid State Technology, Apr. 1977, pp. 63–70.
Publication entitled, "The Anhydrator" by Insync Systems, Inc., 1 page.
Wolf et al., "Silicon Processing for the VLSI Era", vol. 1, pp. 161–195.

Primary Examiner—R. Bruce Breneman
Assistant Examiner—Jeffrie R. Lund
Attorney, Agent, or Firm—Kevin L. Daffer; Conley, Rose & Tayon

[57] ABSTRACT

A low-pressure CVD apparatus is presented including one or more gas heating subsystems which heat process gases prior to their introduction into a reaction chamber of the low-pressure CVD apparatus. As a result, thermal expansions and contractions of the walls of the reaction chamber are reduced, along with the tendency of small particles of deposits on the inner walls of the reaction chamber to flake off. Fewer loose particulates created within the reaction chamber results in a reduction in the number of particulates adhering to surfaces of processed silicon wafers. Each gas heating subsystem includes a heating element thermally coupled to a gas feed line and to a process gas flowing within the gas feed line. Each gas heating subsystem also preferably includes a thermal feedback temperature control mechanism including a temperature sensor and a temperature control unit. The temperature sensor senses the temperature of the heated flow of process gas and produces a corresponding temperature signal. The temperature control unit is coupled to receive the temperature signal from the temperature sensor and controls the temperature of the heating element in response to the temperature signal. The temperature of the process gas entering the reaction chamber may thus be controllably increased.

19 Claims, 4 Drawing Sheets

U.S. PATENT DOCUMENTS

| | | | |
|---|---|---|---|
| 4,545,327 | 10/1985 | Campbell et al. | 118/719 |
| 4,699,805 | 10/1987 | Seelbach et al. | 437/245 |
| 4,753,192 | 6/1988 | Goldsmith et al. | 118/725 |
| 4,910,042 | 3/1990 | Hokynar | 427/38 |
| 4,947,790 | 8/1990 | Gartner et al. | 118/715 |
| 5,074,954 | 12/1991 | Nishizawa | 156/610 |
| 5,146,869 | 9/1992 | Bohannon et al. | 118/724 |
| 5,186,120 | 2/1993 | Ohnishi et al. | 118/667 |
| 5,190,913 | 3/1993 | Higashiyama et al. | 505/1 |
| 5,223,305 | 6/1993 | Tanaka et al. | 427/255.7 |
| 5,279,670 | 1/1994 | Watanabe et al. | 118/725 |
| 5,322,710 | 6/1994 | Visser | 427/248.1 |
| 5,431,733 | 7/1995 | Shibuya et al. | 118/715 |
| 5,451,258 | 9/1995 | Hillman et al. | 118/715 |
| 5,480,488 | 1/1996 | Bittner et al. | 118/667 |
| 5,542,979 | 8/1996 | Matsuno et al. | 118/719 |
| 5,595,606 | 1/1997 | Fujikawa et al. | 118/725 |
| 5,603,772 | 2/1997 | Ide | 118/724 |
| 5,616,208 | 4/1997 | Lee et al. | 156/345 |
| 5,630,878 | 5/1997 | Miyamoto et al. | 118/715 |
| 5,690,743 | 11/1997 | Murakami et al. | 118/715 |

LOW PRESSURE CHEMICAL VAPOR DEPOSITION APPARATUS INCLUDING A PROCESS GAS HEATING SUBSYSTEM

BACKGROUND OF THE INVENTION

1. Field of the Invention

This invention relates to semiconductor device manufacture and more particularly to an apparatus for forming layers of desired materials upon exposed surfaces of semiconductor substrates.

2. Description of the Relevant Art

The fabrication of devices in and on a semiconductor substrate generally employs numerous processing steps. The basic processes involved include layering, patterning, doping, and heat treatments. Layering is the process of forming a layer of a desired material upon the surface of a semiconductor substrate. Layering may be accomplished by oxidation (i.e., growing a native oxide layer on an exposed surface) or by deposition. Layers of metals such as aluminum, tungsten, and titanium are typically deposited on the surface of a silicon substrate using evaporation and sputtering techniques. Layers of other materials, such as silicon dioxide, silicon nitride, and polycrystalline silicon, are typically formed using chemical vapor deposition (CVD) techniques.

In a CVD process, a semiconductor substrate (e.g., a silicon wafer) is placed within a reaction chamber containing one or more reactant gases. Chemical reactions occurring between the reactant gases result in the formation of a layer of a desired solid material upon the exposed surfaces of the silicon wafer. These reactions may occur at any location within the reaction chamber, including in the ambient or on exposed surfaces within the reaction chamber. Reactions occurring in the ambient are undesirable as they tend to form small particles of the desired material which do not adhere well to the surface of the silicon wafer, resulting in a low density layer or a layer with numerous defects. Heating the silicon wafer creates an environment which favors reactions which take place on or near the surface of the wafer, resulting in deposited layers with more desirable characteristics. Accordingly, silicon wafers are typically heated during a CVD process.

During a CVD procedure carried out at atmospheric pressure, the rate at which a layer is deposited on exposed surfaces of a silicon wafer is typically limited by the rate at which reactant gases can be supplied to, and by-products carried away from, the wafer surface. In order to achieve layers with uniform thicknesses, silicon wafers processed at atmospheric pressure are typically positioned on a flat horizontal surface in a side-by-side arrangement at substantially equal distances from a source of reactant gases. At reduced pressures, however, the rate at which a layer is deposited on exposed surfaces of a silicon wafer is typically limited by the rate at which chemical reactions occur at the exposed surfaces. Processing at reduced pressures thus allows highly uniform layers of a desired material to be formed simultaneously on exposed surfaces of many silicon wafers arranged such that their major flat surfaces are parallel to one another, but do not touch. Despite lower deposition rates at reduced pressures, more silicon wafers may be processed in a given amount of time at a reduced pressure than at atmospheric pressure. This increase in process throughput, along with the ability to form layers with highly desirable characteristics, has led to the rapid acceptance of low-pressure CVD techniques in semiconductor manufacturing. See, Wolf et al., *Silicon Processing for the VLSI Era*, Vol. 1, pp. 161–195 (herein incorporated by reference).

A common type of low-pressure CVD (LPCVD) system includes a horizontal tube which functions as a reaction chamber. In this type of LPCVD system, silicon wafers are arranged vertically in a wafer boat, the wafer boat is inserted into the reaction chamber, and the pressure within the reaction chamber is reduced to between 0.1 and 2.0 torr. During deposition, the silicon wafers are heated by at least one heating element surrounding the reaction chamber. As heat energy is transmitted to the silicon wafers through the walls of the reaction chamber, the walls of the reaction chamber absorb a portion of the heat energy and become hot. As a result, chemical reactions also tend to occur on or near the inner wall surfaces of the reaction chamber, and deposits form on the inner wall surfaces of the reaction chamber. Some of these deposits tend to flake off during processing, and also during loading and unloading of the silicon wafers. The portion of the loose particulates which adhere to exposed surfaces of the semiconductor surfaces within the reaction chamber create a particulate problem. A particulate remaining on the surface of a silicon wafer may damage a layer formed over the particulate, potentially rendering an integrated circuit including the particulate and damaged layer inoperative.

Variations in the temperatures of components of a low-pressure CVD apparatus cause these components to expand and contract. Deposits formed on the inner walls of the reaction chamber expectedly flake off more readily as the walls of the reaction chamber expand and contract with variations in temperature. It would thus be advantageous to have a low-pressure CVD apparatus which reduces thermal variations in the walls of a reaction chamber and the resulting expansions and contractions, thus reducing the number of particulates created within the reaction chamber.

SUMMARY OF THE INVENTION

The problems outlined above are in large part solved by a low-pressure CVD apparatus including one or more gas heating subsystems which heat process gases to substantially the temperature within a heated reaction chamber of the low-pressure CVD apparatus prior to their introduction into the reaction chamber. As a result, thermal expansions and contractions of the walls of the reaction chamber are reduced, along with the tendency of small particles of deposits on the inner walls of the reaction chamber to flake off. Fewer loose particulates created within the reaction chamber results in a reduction in the number of particulates adhering to major surfaces of silicon wafers undergoing a low-pressure CVD procedure.

Each gas heating subsystem of the low-pressure CVD apparatus includes a heating element thermally coupled to a gas feed line and to a process gas flowing within the gas feed line. The gas feed line transports the process gas from a gas source to the reaction chamber, the process gas entering the reaction chamber through gas inlet port extending through a wall of the reaction chamber. A process gas is herein defined as gaseous substance used in a CVD procedure. The heating element is thus configured to heat a flow of process gas prior to introduction of the process gas into the reaction chamber.

In a preferred embodiment, each gas heating subsystem includes a gas conduit coupled in a section of a gas feed line extending from a flow control valve to the gas inlet port. A thermal feedback temperature control mechanism includes a temperature sensor and a temperature control unit. The temperature sensor extends through a wall of the gas conduit, and is configured to sense the temperature of the heated flow of gas within the gas conduit and produce a corresponding temperature signal. The temperature control unit is coupled to receive the temperature signal from the temperature sensor and thereafter control the temperature of the heating element in response to the temperature signal. The temperature of the process gas entering the reaction chamber may thus be controllably increased.

The heating element of the gas heating subsystem preferably comprises a resistance coil heated by a flow of electrical current through the resistance coil. The temperature sensor preferably generates an electrical signal in response to the temperature of the heated process gas flowing through the gas conduit. The temperature control unit controls the flow of current through the resistance coil of the heating element in response to the electrical signal received from the temperature sensor.

BRIEF DESCRIPTION OF THE DRAWINGS

Other objects and advantages of the invention will become apparent upon reading the following detailed description and upon reference to the accompanying drawings in which.

Figure 1:
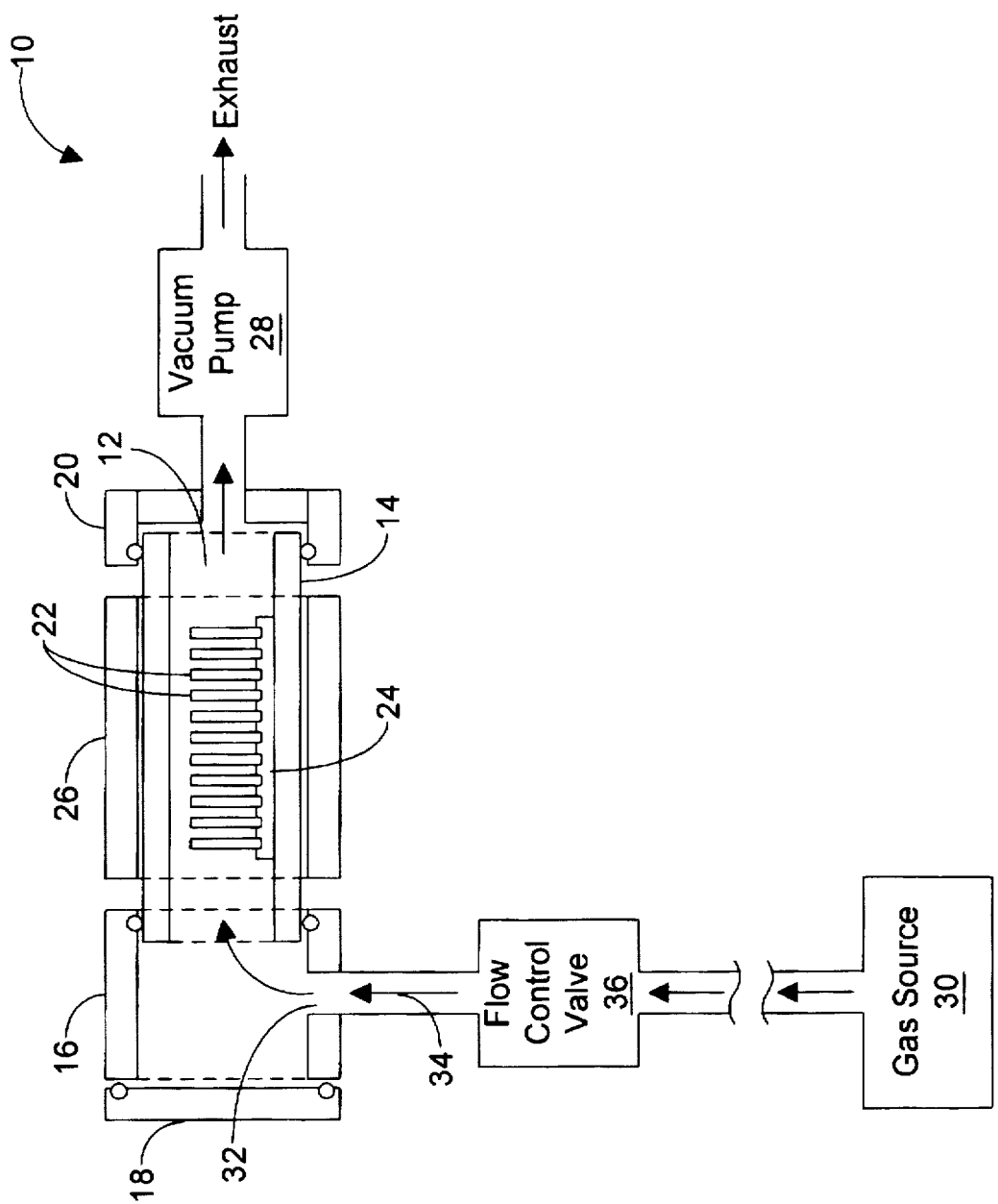
FIG. 1 is a cross-sectional side view of a horizontal tube low-pressure CVD system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
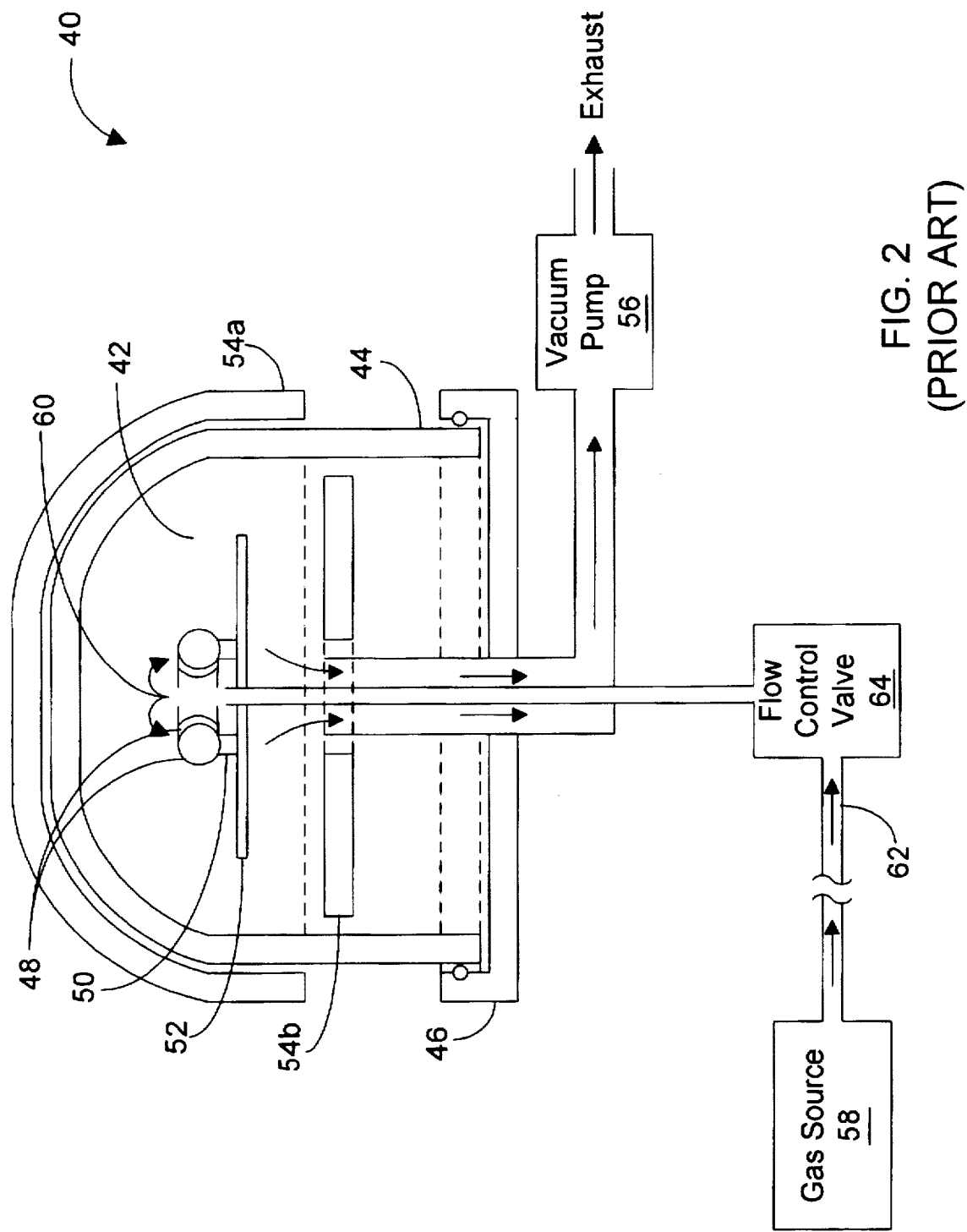
FIG. 2 is a cross-sectional side view of a vertical flow isothermal low-pressure CVD system.

FIGS. 1 and 2 illustrate two common types of low-pressure CVD systems. FIG. 1 is a cross-sectional side view of a horizontal tube low-pressure CVD system 10. Horizontal tube low-pressure CVD system 10 includes a reaction chamber 12 formed within a space enclosed by a conduit section 14, a gas ring 16, a wafer load/unload end cap 18, and an end section 20. Conduit section 14 is typically a hollow tube made from vitreous fused silica. Silicon wafers 22 are placed vertically in a wafer boat 24, and wafer boat 24 is inserted into reaction chamber 12 through an opening formed by temporarily removing wafer load/unload end cap 18. A heating element 26 surrounds an exterior surface of conduit section 14 and is used to heat silicon wafers 22 during a deposition procedure. A vacuum pump 28 removes gas molecules from within reaction chamber 12 prior to and during a deposition procedure. Vacuum pump 28 is used to reduce the pressure within reaction chamber 12 to a desired pressure prior to the deposition procedure, and to maintain the desired pressure within reaction chamber 12 during the deposition procedure.

Horizontal tube low-pressure CVD system 10 includes one or more gas sources 30, each gas source 30 containing a process gas used in a deposition procedure. Process gases include reactant gases, carrier gases, and vent gases. Reactant gases react chemically to form a layer of a desired material upon exposed surfaces of a silicon wafer. Examples of reactant gases include silane, dichlorosilane, oxygen, and ammonia. Carrier gases are inert gases used to transport molecules of reactant gases into reaction chambers. Examples of carrier gases include hydrogen, nitrogen, and argon. Vent gases are used to fill reaction chambers with an inert gas. Examples of vent gases include nitrogen and argon. The pressure within each gas source 30 is higher than the pressure within reaction chamber 12 during processing. Gas ring 16 has one or more gas inlet ports 32. Each gas inlet port 32 is an opening extending through a wall of gas ring 16, and each gas inlet port 32 corresponds to a gas source 30. One or more gas feed lines 34 couple each gas source 30 to the corresponding gas inlet port 32. Thus each gas inlet port 32 allows a flow of a particular process gas to enter reaction chamber 12 during processing. A flow control valve 36 inserted in each gas feed line 34 is used to modulate the flow of a given process gas from a gas source 30 into reaction chamber 12.

FIG. 2 is a cross-sectional side view of a vertical flow isothermal low-pressure CVD system 40. Vertical flow isothermal low-pressure CVD system 40 includes a reaction chamber 42 formed within a space enclosed by a hollow cover section 44 and a base 46. Cover section 44 is shaped like a bell and typically made from vitreous fused silica. Silicon wafers 48 are placed vertically in a circular wafer boat 50, cover section 44 is removed from base 46, and wafer boat 50 is positioned onto a platform 52 attached to base 46. When cover section 44 is repositioned over base 46, reaction chamber 42 is formed around wafer boat 50 containing silicon wafers 48. A heating element 54a surrounds an upper portion of cover section 44, and a heating element 54b is attached to base 46 and located under platform 52. Heating elements 54a and 54b are used to heat silicon wafers 48 during processing. A vacuum pump 56 is used to evacuate reaction chamber 42 prior to and during a deposition procedure.

Vertical flow isothermal low-pressure CVD system 40 includes one or more gas sources 58, each gas source 58 contains a process gas used in deposition procedures. The pressure within each gas source 58 is higher than the pressure within reaction chamber 42 during processing. A gas inlet port 60 extends through a wall of base 46. One or more gas feed lines 62 couple each gas source 58 to a corresponding flow control valve 64. In the typical case of multiple gas sources, the outlets of the associated flow control valves 64 are brought together to form a single gas inlet port 60 prior to gas inlet port 60 entering base 46. Each flow control valve is used to modulate a flow of a given process gas from a gas source 58 into reaction chamber 42 during processing.

It is noted that other types of low-pressure CVD systems exist, including vertical tube low-pressure CVD systems. While the physical configurations of low-pressure CVD systems differ, their operating principles are the same.

During a typical low-pressure CVD process, silicon wafers are placed within a reaction chamber. The heating elements are activated, and the reaction chamber is heated to the desired processing temperature level. During a temperature stabilization period, the vacuum pump is activated, and the pressure within the reaction chamber is reduced to a base level (e.g., 5–10 mTorr) during a pump down procedure. The pressure within the reaction chamber is then increased to a desired processing pressure by introducing one or more reactant gases into the reaction chamber. The desired processing pressure is below atmospheric pressure, and is typically between 150 mTorr and 230 mTorr. The silicon wafers within the reaction chamber are thus subjected to desired flow rates of one or more reactant gases. It is noted that the one or more reactant gases may be mixed with carrier gases. After a period of time necessary to deposit a desired thickness of a desired material upon the silicon wafers, the flows of the reactant gases are shut off. The heating elements are either deactivated or switched to standby states in which their heat outputs are reduced. The pressure within the reaction chamber is reduced to about 0.001 torr, and the vacuum pump is deactivated. The pressure within the reaction chamber is then increased to atmospheric pressure through the introduction of a vent gas. The silicon wafers are then removed from the reaction chamber.

During processing, the silicon wafers are heated by one or more heating elements surrounding the reaction chamber. The walls of the reaction chamber absorb some of the heat energy emitted by the heating elements, and deposits form on the inner wall surfaces of the reaction chamber. Some of these deposits flake off during processing, or during wafer loading and unloading, creating a particulate problem. Several aspects of a given low-pressure CVD procedure tend to govern the severity of the particulate problem, including (i) the density of the layer deposited upon the inner walls of the reaction chamber, and the adherence of this layer to the inner walls of the reaction chamber, (ii) the variance in the temperature within the reaction chamber, and (iii) the physical arrangement of the silicon wafers within the reaction chamber. A dense layer formed on the inner walls of a reaction chamber which adheres well to the inner walls is less likely to flake off during processing or during loading and unloading operations.

Components of the low-pressure CVD apparatus expand and contract with changes in temperature. Particles on the inner walls of the reaction chamber expectedly flake off more readily as the walls of the reaction chamber expand and contract with variations in temperature. As described below, reaction chamber walls may experience temperature variations when process gases are introduced into the reaction chamber. Some of the particles which flake off of the inner walls of a reaction chamber subsequently adhere to major flat surfaces of the silicon wafers within the reaction chamber, creating a particulate contamination problem.

Process gases are typically stored under pressure and at temperatures of about 21° C., significantly lower than typical low-pressure CVD processing temperatures of 500° C. to 800° C. In addition, the pressurized gasses expand as they pass through pressure regulators and flow control devices, resulting in a cooling effect which cools the gases to below 21° C. Quickly introducing a significant quantity of process gas at a relatively low temperature into a heated reaction chamber of a low-pressure CVD apparatus may cause a temperature gradient to form across the walls of the reaction chamber. These temperature variations cause the walls of the reaction chamber to expand and contract. As mentioned above, thermal expansions and contractions of the reaction chamber walls expectedly result in an increase in the number of particles on the inner walls of the reaction chamber flaking off and becoming loose particulates within the reaction chamber.

One way to reduce temperature variations in the walls of the reaction chamber, and the resultant thermal expansions and contractions of reaction chamber walls, is to heat process gases to substantially the temperature within the reaction chamber before introducing the process gases into the reaction chamber. As thermal expansions and contractions of reaction chamber walls are reduced, fewer particles on the inner walls of the reaction chamber flake off, and the particulate problem is reduced. It is believed that the benefit derived is inversely proportional to the difference between the temperature of the inner walls of the reaction chamber and the temperature of the process gas introduced into the reaction chamber. Thus the greatest benefit is obtained when the temperature of the process gas introduced into the reaction chamber is at the same temperature as the inner walls of the reaction chamber.

Figure 3:
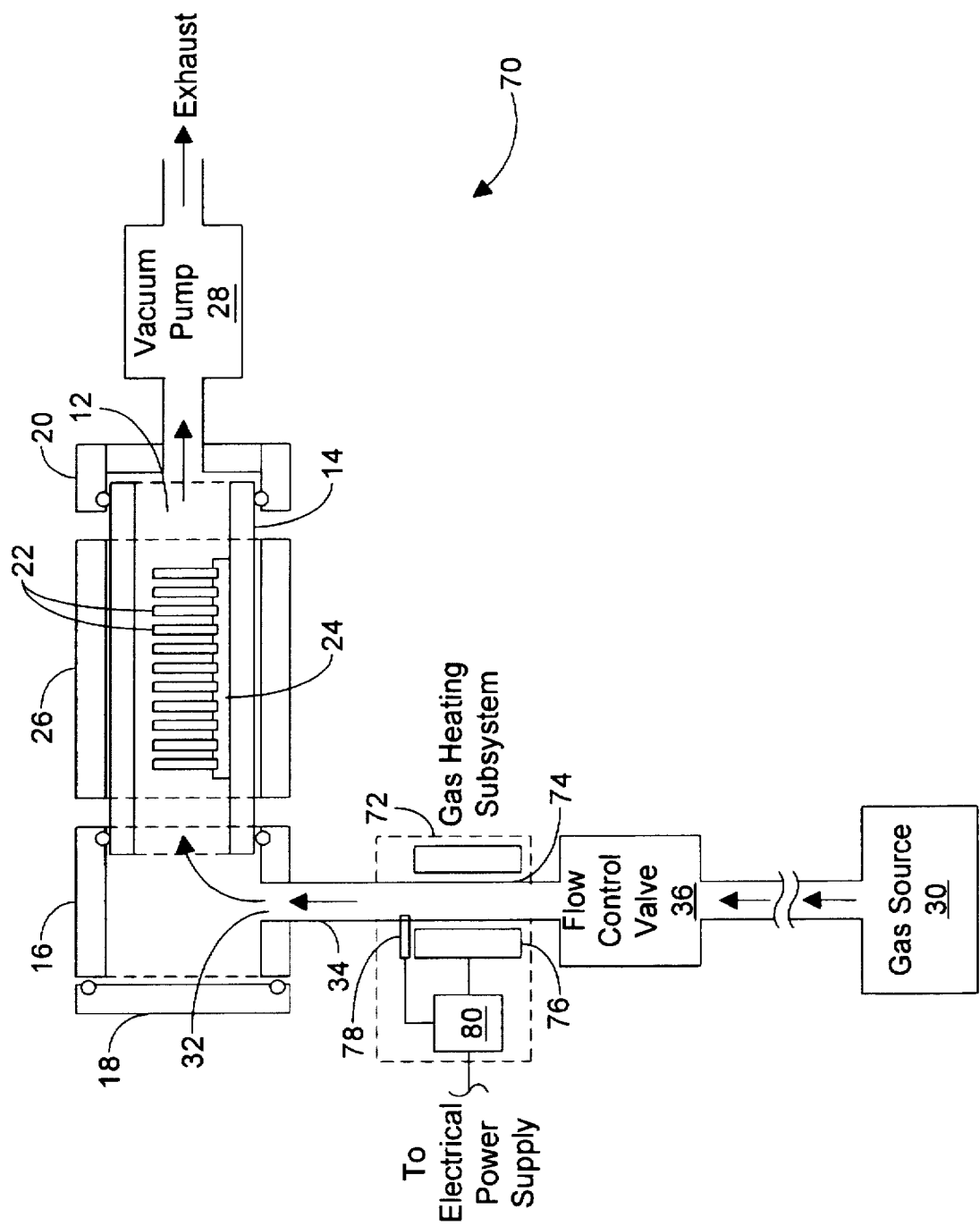
FIG. 3 is a cross-sectional side view of a horizontal tube low-pressure CVD system including one or more gas heating subsystems in accordance with a preferred embodiment of the present invention.

FIG. 3 is a cross-sectional side view of a horizontal tube low-pressure CVD system 70 including one or more gas heating subsystems 72 in accordance with a preferred embodiment of the present invention. Each gas heating subsystem 72 is associated with a particular process gas, and is used to heat the process gas before the process gas is introduced into reaction chamber 12 through associated gas inlet port 32.

The preferred embodiment of gas heating subsystem 72 shown in FIG. 3 includes a gas conduit 74 surrounded by a heating element 76, a temperature sensor 78, and a temperature control unit 80. Gas conduit 74 is inserted in gas feed line 34 between flow control valve 36 and gas inlet port 32, and is configured to contain the flow of process gas present in gas feed line 34. Gas conduit 74 is easily removed from gas feed line 34, facilitating removal and replacement of gas heating subsystem 72. Heating element 76 is thermally coupled to (i.e., in contact with or in close proximity to) gas conduit 74, thus heat energy from heating element 76 is transferred to gas conduit 74 and a process gas flowing through gas conduit 74. The inner wall of gas conduit 74 may have structures which project into the hollow central area of gas conduit 74, facilitating the transfer of heat energy to the process gas flow by ensuring a high degree of thermal coupling between heated surfaces within gas conduit 74 and molecules of the process gas passing through gas conduit 74.

The preferred embodiment of FIG. 3 also includes a thermal feedback temperature control mechanism including temperature sensor 78 and temperature control unit 80. Temperature sensor 78 extends through a wall of gas conduit 74, and generates a temperature signal in response to the temperature of the heated process gas flowing through gas conduit 74. Temperature control unit 80 is coupled to receive the temperature signal generated by temperature sensor 78, and is configured to control the temperature of heating element 76 in response to the temperature signal. The temperature of flowing process gas introduced into process chamber 12 through gas inlet 32 may thus be controlled using thermal feedback provided by temperature sensor 78 to temperature control unit 80.

Heating element 76 preferably includes a resistance coil heated by a flow of electrical current through the resistance coil. Temperature sensor 78 generates an electrical signal in response to the temperature of the heated process gas flowing through gas conduit 74, and temperature control unit 80 controls the flow of current through the resistance coil of heating element 76 in response to the electrical signal received from temperature sensor 78.

Figure 4:
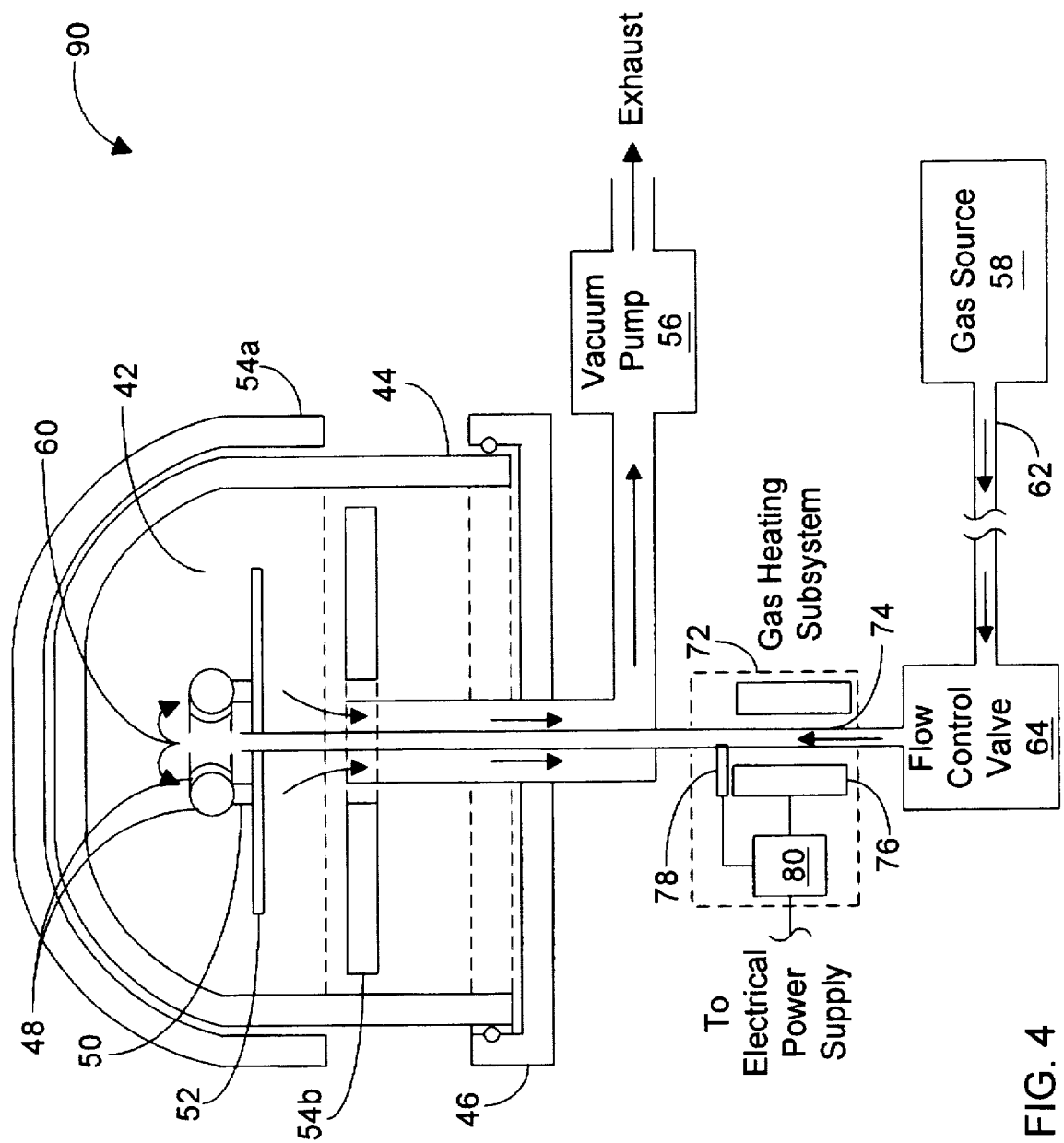
FIG. 4 is a cross-sectional side view of a vertical flow isothermal low-pressure CVD system including one or more gas heating subsystems in accordance with the preferred embodiment of the present invention.

FIG. 4 is a cross-sectional side view of a vertical flow isothermal low-pressure CVD system 90 including one or more gas heating subsystems 72 in accordance with a preferred embodiment of the present invention. Each gas heating subsystem 72, inserted in a gas feed line between a flow control valve 64 and gas inlet port 60, operates as described above to heat a flow of a process gas before the process gas is introduced into reaction chamber 42 through gas inlet port 60.

It is noted that a significant quantity of a vent gas is introduced into a reaction chamber at the conclusion of a low-pressure CVD procedure in order to increase the pressure within the reaction chamber to atmospheric pressure. It is thus believed that adding a gas heating subsystem to the feed gas line delivering the vent gas to the reaction chamber will result in the greatest reduction in the number of loose particulates created within the reaction chamber, and hence the greatest reduction in the number of particulates adhering to major surfaces of processed silicon wafers. Additional benefit may be gained by adding gas heating subsystems to other gas feed lines, however. In addition, while FIGS. 3 and 4 show a preferred embodiment of a gas heating subsystem, the simplest embodiment envisioned includes a heating element thermally coupled to a section of a gas feed line. While this embodiment includes no thermal feedback control mechanism, the temperature of the heating element may be adjusted to provide a measure of heat energy to a process gas flowing through the gas feed line.

It is also noted that other processes employing the introduction of one or more process gases into a reaction chamber maintained at a pressure below atmospheric pressure may also benefit from this invention when the temperature within the reaction chamber is greater than the temperature of the one or more process gases. Such low-pressure processes include material depositions by evaporation and sputtering, as well as dry etching processes carried out at reduced pressure.

It will be appreciated to those skilled in the art having the benefit of this disclosure that this invention is believed to be a low-pressure CVD apparatus including one or more gas heating subsystems to heat one or more process gases prior to introduction of the process gases into a reaction chamber of the low-pressure CVD apparatus. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A gas heating subsystem to reduce particulate contamination of semiconductor substrates contained within a reaction chamber of a chemical vapor deposition system, comprising:

a gas conduit coupled in a gas feed line of the chemical vapor deposition system and configured to contain a flow of gas from a gas source to the reaction chamber, wherein said gas conduit is coupled to the gas feed line in a manner such that said gas conduit can be easily removed from the gas feed line;

a heating element thermally coupled to said gas conduit and configured to heat said gas conduit and the flow of gas within said gas conduit;

a temperature sensor extending through a wall of said gas conduit for sensing the temperature of gas within said gas conduit; and a temperature control unit coupled to receive output from the temperature sensor for controlling the temperature of the heating element.

2. The gas heating subsystem recited in claim 1, wherein said gas conduit includes an inner wall having structures projecting into a hollow central area of said gas conduit to facilitate the transfer of heat energy to the flow of gas within said gas conduit.

3. A gas heating subsystem to reduce particulate contamination of semiconductor substrates contained within a reaction chamber of a chemical vapor deposition system, comprising:

a gas conduit coupled in a gas feed line of the chemical vapor deposition system and configured to contain a flow of reactant gas from a gas source to the reaction chamber;

a heating element thermally coupled to the gas conduit and configured to heat the flow of gas within the gas conduit;

a temperature sensor extending through a wall of the gas conduit, wherein the temperature sensor is configured to sense the temperature of the heated flow of gas within the gas conduit and to produce a corresponding temperature signal; and a temperature control unit coupled to receive the temperature signal and control the temperature of the heating element in response to the temperature signal.

4. The chemical vapor deposition reactor as recited in claim 3, wherein the heating element comprises a resistance coil heated by a flow of electrical current through the resistance coil, and the temperature control unit is configured to control the flow of electrical current through the resistance coil of the heating element.

5. The gas heating subsystem recited in claim 3, wherein said gas conduit includes an inner wall having structures projecting into a hollow central area of said gas conduit to facilitate the transfer of heat energy to the flow of gas within said gas conduit.

6. A chemical vapor deposition reactor, comprising:

a reaction chamber;

a gas inlet port extending through a wall of the reaction chamber;

a gas source;

a gas feed line coupled between the gas source and the gas inlet port; and a gas heating subsystem coupled in the gas feed line for heating a flow of gas from the gas source to the process gas inlet port, wherein the gas heating subsystem includes a temperature sensor configured to sense the temperature of the heated flow of gas and to produce a corresponding temperature signal and a temperature control unit coupled to receive the temperature signal from the temperature sensor and configured to control the temperature of the flow of gas in response to the temperature signal.

7. The chemical vapor deposition reactor as recited in claim 6, wherein a conduit section forms a portion of the reaction chamber.

8. The chemical vapor deposition reactor as recited in claim 7, wherein the conduit section is made from vitreous fused silica.

9. The chemical vapor deposition reactor as recited in claim 8, wherein the conduit section is a hollow tube.

10. The chemical vapor deposition reactor as recited in claim 6, wherein a bell-shaped cover section forms a portion of the reaction chamber.

11. The chemical vapor deposition reactor as recited in claim 10, wherein the cover section is made from vitreous fused silica.

12. The chemical vapor deposition reactor as recited in claim 6, wherein the reaction chamber comprises an gas ring which forms a wall of the reaction chamber, and the gas inlet port extends through the gas ring.

13. The chemical vapor deposition reactor as recited in claim 6, wherein the reaction chamber comprises a base which forms a wall of the reaction chamber, and the gas inlet port extends through the base.

14. The chemical vapor deposition reactor as recited in claim 6, wherein the gas source contains a gas maintained at a higher pressure than the pressure within the reaction chamber.

15. The chemical vapor deposition reactor as recited in claim 14, wherein the gas comprises nitrogen ($N_2$).

16. The chemical vapor deposition reactor as recited in claim 14, wherein the gas comprises argon (Ar).

17. The chemical vapor deposition reactor as recited in claim 6, further comprising a vacuum pump configured to reduce the pressure within the reaction chamber below atmospheric pressure.

18. The chemical vapor deposition reactor as recited in claim 6, further comprising a flow control valve inserted in the gas feed line and configured to modulate the flow of gas from the gas source to the gas inlet port.

19. The chemical vapor deposition reactor as recited in claim 6, further comprising one or more heating elements for heating semiconductor substrates placed within the reaction chamber.

* * * * *